US006501107B1

United States Patent
Sinclair et al.

(10) Patent No.: US 6,501,107 B1
(45) Date of Patent: Dec. 31, 2002

(54) ADDRESSABLE FUSE ARRAY FOR CIRCUITS AND MECHANICAL DEVICES

(75) Inventors: Michael J. Sinclair, Kirkland, WA (US); Jeremy A. Levitan, Cambridge, MA (US)

(73) Assignee: Microsoft Corporation, Redmond, OR (US)

( * ) Notice: Subject to any disclaimer, the term of this patent is extended or adjusted under 35 U.S.C. 154(b) by 0 days.

(21) Appl. No.: 09/452,886

(22) Filed: Dec. 1, 1999

Related U.S. Application Data
(60) Provisional application No. 60/110,680, filed on Dec. 2, 1998.

(51) Int. Cl.$^7$ ............................................. H01L 27/10
(52) U.S. Cl. ..................... 257/209; 257/208; 257/210; 257/211; 257/529
(58) Field of Search ................................ 257/208–209, 257/529, 210–211

(56) References Cited

U.S. PATENT DOCUMENTS

| 5,192,946 A | 3/1993 | Thompson et al. |
| 5,206,983 A | 5/1993 | Guckel et al. |
| 5,530,342 A | 6/1996 | Murphy |
| 5,644,177 A | 7/1997 | Guckel et al. |
| 5,658,063 A | 8/1997 | Nasserbakht |
| 5,808,384 A | 9/1998 | Tabat et al. |
| 5,824,910 A | 10/1998 | Last et al. |

OTHER PUBLICATIONS

Fedder, Simulation of Microelectromechanical Systems, A dissertation, submitted in partial satisfaction of the requirements for the degree of Doctor of Philosophy in Engineering–Electrical Engineering and Computer Sciences in the Graduate Division of the University of California at Berkelely, 1994.

Adams, Design of Electrostatic Actuators to Tune the Effective Stiffness of Micro–Electri–Mechanical Systems, A Dissertation Presented to the Faculty of the Graduate Schoolof Cornell University in Partial Fulfillment of the Requirements for the Degree of Doctor of Philosophy, 1996.

Yao & MacDonald, A micromachined, single–crystal silicon, tunable resonator, 1996.

Nguyen & Howe, Design and Performance of CMOS Micromechanical Resonator Oscillators, 1994 IEEE International Frequency Control Symposium, 1994.

(List continued on next page.)

*Primary Examiner*—Fetsum Abraham
(74) *Attorney, Agent, or Firm*—Ipsolon LLP

(57) ABSTRACT

A fuse array having a plurality of fusible links that can be addressed by two electrodes is disclosed. The fuse array includes two conductive strips having the plurality of fusible links located therebetween and electrically coupled to the conductive strips. The fusible links have different electrical resistance and each fusible link includes a fuse portion. A voltage potential applied across the conductive strips induces current flow through the fusible links in accordance with Ohm's law and ohmic heating occurs at the fuse portion in proportion to the square of the current. The voltage is increased to cause sufficient ohmic heating to occur in the most conductive fusible link (the fusible link having the lowest electrical resistance) so that the fuse portion in that fusible link fuses. Because the fusible links are connected in parallel to the conductive strips, an equivalent resistance of the plurality of fusible links increases and the current flow diminishes so that no further fuse portions are fused at the selected voltage level. Thereafter, the voltage level may be increased to fuse the most conductive fusible link remaining that is not fused. The fuse array may be incorporated into a circuit as a resistor that can be tuned to circuit requirements or as a physical structure in MEMS devices wherein the fuse array may be tuned to change physical properties of the MEMS device.

60 Claims, 6 Drawing Sheets

OTHER PUBLICATIONS

Lin, Howe, & Pisano, Microelctromechanical Filters for Signal Processing, Journal of Microelectromechanical Systems, 1998.

Burrer, Esteve, & Lora–Tamayo, Resonant Silicon Accelerometers in Bulk Micromachining Technology—An Approach, Journal of Micromechanical Systems, 1996.

Adams, Bertsch, Shaw, & MacDonald, Independent Tuning of Linear and Nonlinear Stiffness Coefficients, Journal of Microelectromechanical Systems, 1998.

Lee & Cho, A triangular electrostatic comb array for micromechanical resonant frequency tuning, Sensors and Actuators, 1998.

Adams, Bertsch, Shaw, Hartwell, Moon & MacDonald, Capacitance Based Tunable Resonators, 1998.

Fedder, Chang & Howe, Thermal Assembly of Polysilicon Microactuators with Narrow Gap Electrostatic Comb Drive, IEEE, 1992.

Tang, Nguyen & Howe, Laterally Driven Polysilicon Resonant Microstructures, Sensors and Actuators, 1989.

Adams, Bertsch, Shaw, Hartwell, MacDonald & Moon, Capacitance Based Tunable Micromechanical Resonators, 1995.

Johnson, Borner & Konno, Mechanical Filters–A Review of Progress, IEEE Transactions, 1971.

Hathaway & Babcock, Survey of Mechanical Filters and Their Applications, Proceedings of the IRE, 1957.

Johnson & Warne, Electrophysics of Micromechanical Comb Actuators, Journal of Microelectromechanical Systems, 1995.

Freidberger & Muller, Improved Surface–Micromachined Hinges for Fold–Out Structures, Journal of Microelectromechanical Systems, 1998.

Koester, Mahadevan, Shiskoff & Markus, MUMPs Design Handbook, Rev. 4, MEMS Technology Application Center, MCNC, 1996.

Anathasuresh, Lai & Moulton, Mechanical Design with Unconventional Actuations.

Comtois, Michalicek & Barron, Electrothermal Actuactors Fabricated in Four–Level Planarized Surface Micromachined Polycystalline Silicon, Sensors and Actuators, 1998.

Judy, Muller & Zappe, Magnetic Microactuation of Polysilicon Flexure Structures, Journal of Microelectromechanical Systems, 1995.

Miller & Tai, Micromachined Electromagnetic Scanning Mirrors, Society of Photo–Optical Instrumentation Engineers, 1997.

Ming, Kent & Crawford, Self–Assembled Microactuated XYZ Stages for Optical Scanning and Alignment, 1997 International Conference of Solid–State Sensors and Actuators, 1997.

Shimoyama, Kano & Miura, 3D Micro–structures Folded by Lorentz Force, IEEE, Eleventh Annual International Workshop on Micro Electro Mechanical Systems, 1998.

Klonis, A Unique Package Design for Digital Micromirror Devices, 1997 International Symposium on Microelectronics, 1997.

Fullin, Gobet, Tilmans & Bergqvist, A New Basic Technology for Magnetic Micro–Actuators, IEEE, 1998.

Petersen, Silicon Torsional Scanning Mirror, IBM, J. Res. Develop, 1980.

Wright, Tai & Chang, A Large–Force, Fully Integrated MEMS Magnetic Actuator, 1997 International Conference on Solid–State Sensors and Actuators, 1997.

Yanagisawa, Tago, Ohkubo & Kuwano, Magnetic Micro–Actuator, IEEE Micro Electro Mechanical Systems, 1991.

Kiang, Solgaard, Lay & Muller, Polysilicon Optical Microscanners for Laser Scanning Displays, Sensors and Actuators, 1998.

Lin & Lin, Vertically Driven Microactuators by Electrothermal Buckling Effects, Sensors and Actuators, 1998.

Kiang, Solgaard, Lau & Muller, Polysilicon Optical Microscanners for Laser Scanning Displays, Sensors and Actuators, 1998.

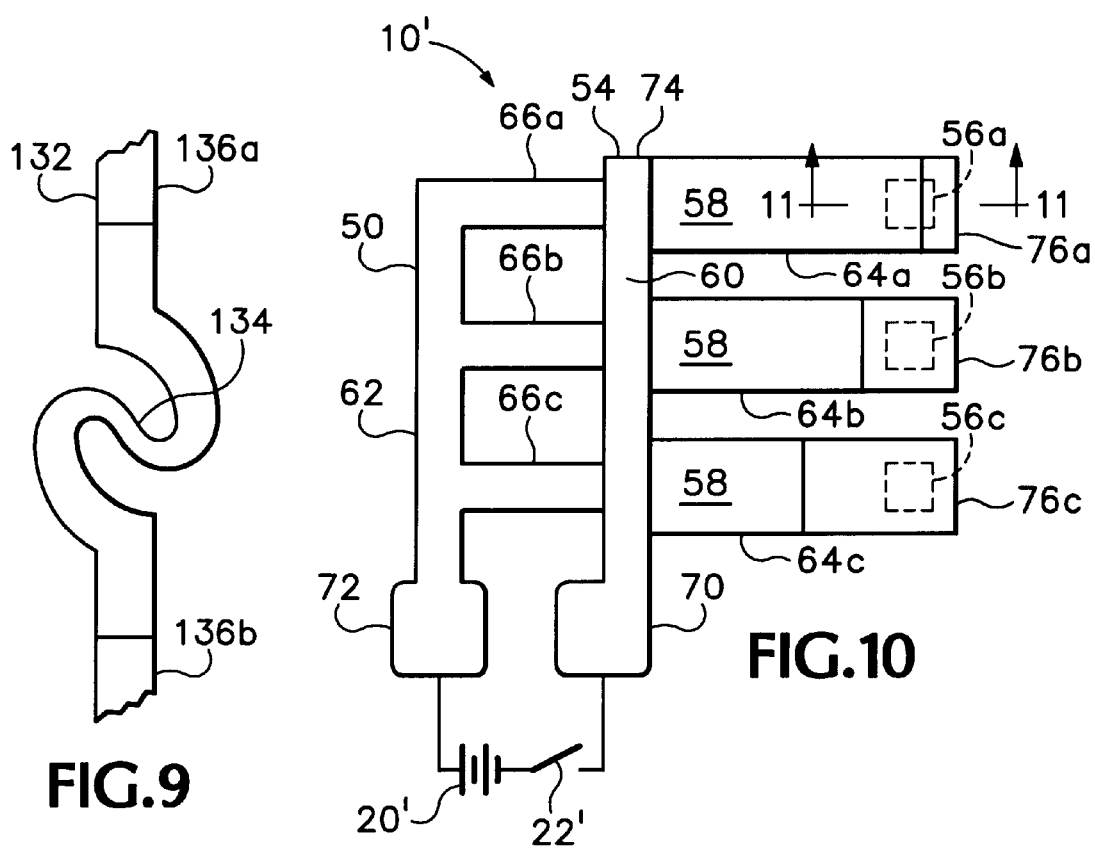
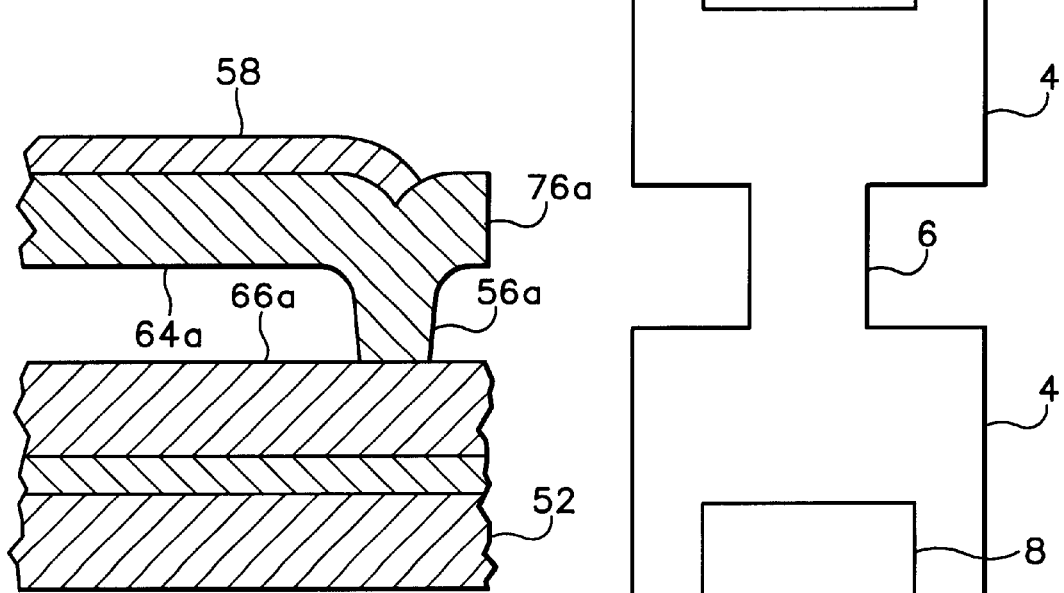

ADDRESSABLE FUSE ARRAY FOR CIRCUITS AND MECHANICAL DEVICES

This application claims the benefit of provisional application 60/110,680 filed Dec. 2, 1998.

BACKGROUND OF THE INVENTION

1. Field of the Invention

This invention pertains to fuse arrays, and more particularly fuse arrays that can be fabricated on integrated circuits and electrically modified to vary their electrical and mechanical properties.

2. Description of the Related Art

A fusible link is an electrical conductor that can be melted, or broken, by ohmic heating. Fusible links, or simply, fuses, are common in consumer electronics to prevent circuit damage that can be caused by excess current. Thus, in a fused circuit, the fuse provides an electrical path within the circuit that acts as a normal conductor until a predetermined amount of excess current attempts to pass through the fuse. The excess current causes the fuse to heat excessively until the fuse fuses, i.e., melts or breaks, thereby creating an open circuit to prevent damage to other circuit components.

A polysilicon micro-fuse 2 is known in the art and shown in FIG. 12. Known as a resistive microbridge fuse, this fuse includes enlarged ends 4 coupled by a relatively thinner fuse portion 6, known as a dog bone structure. Pads 8 provide contacts for electrical connection and include a Cr/Au metal top layer. In such devices, ohmic heating, H, may be approximated as $H=I^2Rt$, where I is current passing through the microbridge fuse, R is resistance and t is time. The current that fuses the microbridge fuse is defined by $I_c=(H_c/\pi/R)^{1/2}$, where, $H_c$ is the total heat flow into the fuse, $\tau$ is the thermal time and is defined as $L^2/\alpha_p\pi^2$ (where L is the fuse length and $\alpha_p$ is the thermal diffusivity of the fuse material). When I is less that Ic, the microbridge fuse conducts current indefinitely, but when I>Ic, the fuse blows and creates an open circuit.

Prior art circuits may incorporate many such resistance microbridge fuses to allow many identical circuits to be fabricated by one mask set and then customized by blowing or leaving fuses as desired. In order to blow a prior art fuse, each such resistance microbridge fuse requires that it be separately addressed. Thus, a circuit having 100 resistance microbridge fuses would require at least 101 electrodes, one for each fuse and one for a common ground. Further, using a common ground requires that the ground be a very large, low resistance bus so that the ground does not act as a fuse. These requirements imposes a large burden on designers and fabricators, particularly for large-scale integrated circuits.

Some prior art applications use lasers to trim fuses to customize properties for a particular circuit. Thus, a generic circuit will be fabricated having a plurality of resistors coupled to a circuit. After fabrication, the resistors may be cut by laser to modify the equivalent resistance of the plurality of resistors. While feasible, such secondary fabrication steps are expensive.

Further, these prior art fuses are only used for electrical connections. Because each fuse must be separately addressed, which requires a large number of electrodes, the use of such prior art microbridge fuses for customizing mechanical properties is impractical.

Within microelectromechanical systems (MEMS) art, mechanical resonators have application as mechanical filters for use in electrical circuits. Such mechanical filters are especially applicable as band-pass filters in high performance communication receivers, such as mobile telephones. Typical mechanical resonators that are used as filters have a plurality of resonant masses interconnected by wire couplers. The center frequency, bandwidth, and filter skirt are a function of the resonant mass size, spacing, number of elements, and mass-couplers (viz. the mass-coupler geometry).

Early mechanical filters were primarily large isolated resonators. More recently electromechanical filters have been incorporated into electrical circuits as MEMS. Because these mechanical structures are circuit mounted, they are designed and installed to operate at a specific center frequency and bandwidth. Customizing the resonate filter after incorporation into a circuit has heretofore been substantially impractical. In order to change a filter's characteristics, a new circuit design must be fabricated. This requirement increases cost and makes prohibitively expensive the use of such mechanical filters in anything other than large scale fabrication.

In addition, even "identical" micromechanical resonators, fabricated on the same die, will have variations in their respective resonant frequencies. Thus, such micromechanical resonators must be tuned prior to use. Prior art methods of tuning such resonators include laser trimming and selective deposition.

A prior art method of fabrication of MEMS is a multi-user MEMS process (referred to as MUMPs). In general, the MUMPs process provides up to three-layers of conformal polysilicon that are etched to create a desired physical structure. The first layer, POLY 0, is coupled to a supporting nonconductive wafer. The second and third layers, POLY 1 and POLY 2, are mechanical layers that can be separated from their underlying structure by the use of sacrificial layers that separate the layers during fabrication and are removed near the end of the process. The POLY 1 and POLY 2 layers may also be fixed to the underlying structure (the wafer or lower POLY 0 or POLY 1 layer as the case may be) through openings, or vias, made by etching.

The MUMPs process also provides for a final top layer of 0.5 $\mu$m thick metal for probing, bonding, electrical routing and reflective mirror surfaces.

Further information of the MUMPs process is available from Cronos Microsystems, Inc., 3021 Cornwallis Road, Research Triangle Park, N.C.

In preferred embodiments, the device of the present invention is fabricated by the MUMPs process. However, the MUMPs process may change as dictated by the Cronos Microsystems, Inc. or other design considerations. The MUMPs fabrication process is not a part of the present invention and is only one of several processes that can be used to make the present invention.

SUMMARY OF THE INVENTION

The present invention provides a fuse array for microelectromechanical systems (MEMS) that can be tuned or customized without separately addressing individual fuses. Thus, the fuse array is addressable in that any number of fuses in a sequence may be selectively blown by a common set of conductors. In particular, the present invention provides a plurality of fuses that can be addressed by two electrodes. By reducing the number of electrodes to control a plurality of fuses, circuit designs that incorporate such fuse arrays can made considerably more simple. In addition, because only two electrodes are necessary to address a plurality of fuses, such fuse arrays can be incorporated into mechanical designs and selectively blown to tune or customize mechanical properties in MEMS.

In a preferred embodiment of the present invention, a fuse array includes two conductive pads having a plurality of fuse links electrically connected in parallel between the pads. Each fuse link is a layer of polysilicon that is partially covered with a metal layer. Located along the length of the fuse link is a fuse portion that physically breaks (or blows in the vernacular) when the current in the fuse link exceeds the cutting current.

A substantially similar structure may be used in mechanical systems to customize dynamics between two or more masses. In such systems, the fuse links may be more properly referred to as fuse beams and the fuse beams are coupled to the masses, or to a single mass and a supporting structure such as a substrate.

The metal layer of the fuse links controls an electrical resistance of the link. And, as can be seen above, ohmic heating is directly proportional to the resistance and the square of the current. For a given voltage potential across the pads, the current in each link is proportional to the resistance across the respective link (Ohm's law: V=IR). Thus, the fuse link having the most metal across the length of the link will have the least resistance, (i.e., they are the most conductive) and conduct, or pass, the most current. And because ohmic heating increases in proportion to the square of the current, the ohmic heating increases even as the resistance is reduced. If the current in the most conductive link is greater than the cutting current, the fuse in that link is blown. And, because the links are connected in parallel, the equivalent resistance of the links, that is the resistance of all the links in parallel, becomes greater. Accordingly, in order to blow the next most conductive fuse link requires that the voltage across the pads be increased. In this manner, a desired number of fuse links may be blown to create a desired resistance between the pads for customizing a circuit.

Similarly, where the fuse links are arranged exemplarily as fuse beams between masses in a resonator, a voltage may be applied across the masses to blow a desired number of fuse beams in order to tune the resonator.

Thus, the fuse array of the present invention permits fabrication of a general resonator design that can be tuned for a particular application after fabrication. Thus, resonators need not be custom designed for a particular application prior to fabrication and large scale fabrication of generic designs may be made to benefit from the economies of scale, which generic designs are later tuned for a specific application.

Thus, although resonators are know in the prior art, an obstacle to their use on circuits, and in MEMS, is the problem of tuning the resonator for a desired parameter, such as a center frequency or bandwidth where the resonator is to be used as a filter. Because the fuse array of the present invention may be fabricated as fuse beams that extend between physical masses, such fuse beams may then be used as couplings between masses and tuned by application of electrical signals. The fuse beams may be addressed and blown as are the fuse arrays, to tune, or customize, the resonator.

BRIEF DESCRIPTION OF THE DRAWINGS

FIG. 9 is an enlarged view of a portion of a fuse beam of FIG. 7 showing an alternative embodiment of a fuse portion.

FIG. 10 is a schematic top view of a vertically arranged fuse array of the present invention.

FIG. 11 is an enlarged cross-section view of the vertically arranged fuse array of FIG. 10 as seen along line 11—11.

FIG. 12 is a plan view of a prior art resistance-type microbridge fuse.

DETAILED DESCRIPTION OF THE PREFERRED EMBODIMENT

General Description of Exemplary Embodiments

Figure 1:
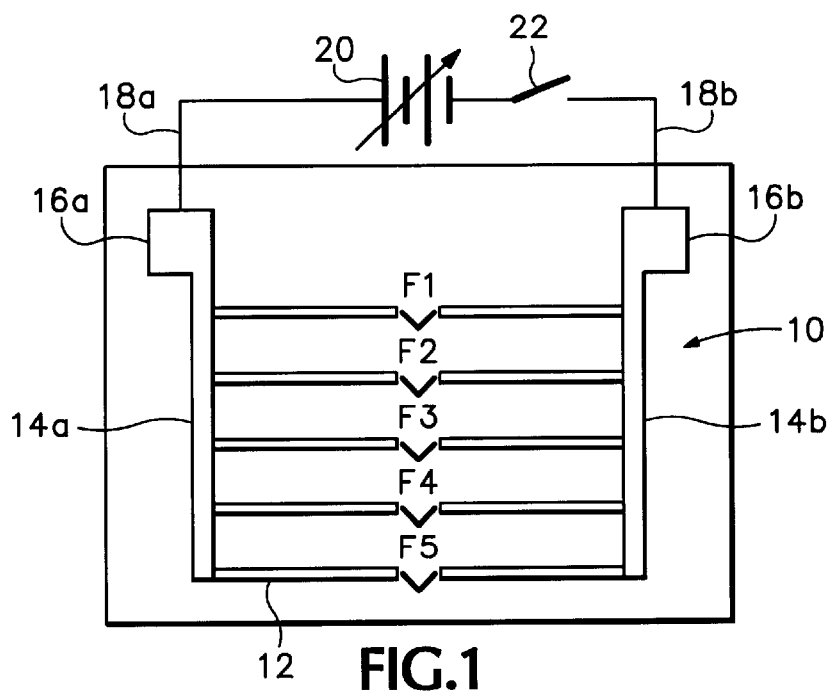
FIG. 1 is a schematic representation of a five link fuse array of the present invention connected to a variable voltage supply and a switch.

The present invention is a fuse array in which individual fuses can be addressed and modified by two electrodes. Because only two electrodes are needed to address all fuses of the fuse array, the fuse array can be adapted to mechanical, as well as electrical, devices so that general designs can be mass produced and then customized for particular applications. FIG. 1 schematically represents a fuse array 10 of the present invention wherein five fusible links 12 having fuses F1–F5 extend between pad strips 14a and 14b. Pads 16a and 16b terminate each pad strip 14a and 14b, respectively. Two electrodes 18a and 18b extend from the respective pads and connect to a variable DC voltage source 20 and a switch 22.

In preferred embodiments, the resistance across each fusible link is different. Exemplarily, the fusible link having fuse F1 has a resistance R1, the fusible link having fuse F2 has a resistance R2, and so on, and wherein R1>R2>R3>R4>R5. And, because the fusible links are electrically connected in parallel, an equivalent resistance R between pad strips 14a and 14b is R=(1/R1+1/R2+1/R3+1/R4+1/R5)$^{-1}$.

When switch 22 is closed, the voltage of voltage supply 20 is applied across the fusible links 12 and the current passing through each fusible link is simply I=V/Rn, where Rn is the resistance across the respective fuse link having fuse Fn, (n=1, 2, 3, 4, or 5). The lower resistance links will conduct the most current. Increasing the voltage will increase the current through all the fusible links proportionately to their respective resistance until the fusible link having the least resistance reaches its cutting current and the fuse blows.

In the current example the fusible link having fuse F5 has the least resistance and will thus blow first. Thereafter, the equivalent resistance across the remaining four fusible links will increase because the fusible links are in parallel arrangement and the current flow will diminish at the same voltage. The voltage may thereafter be increased further in order to blow the next most conductive fusible link, which is the fusible link having fuse F4 in the example. The equivalent resistance across the remaining three fusible links will again increase. In this manner, the fuse array may be customized to provide a desired resistance value for electrical circuits. Also, in the event the fusible links are configured as mechanical connections between masses (i.e., as fuse beams), the fusible links may be individually blown by a variable voltage connected to two electrodes to tune the dynamics between the masses.

Preferred Embodiments of the Fuse Array

Figure 4:
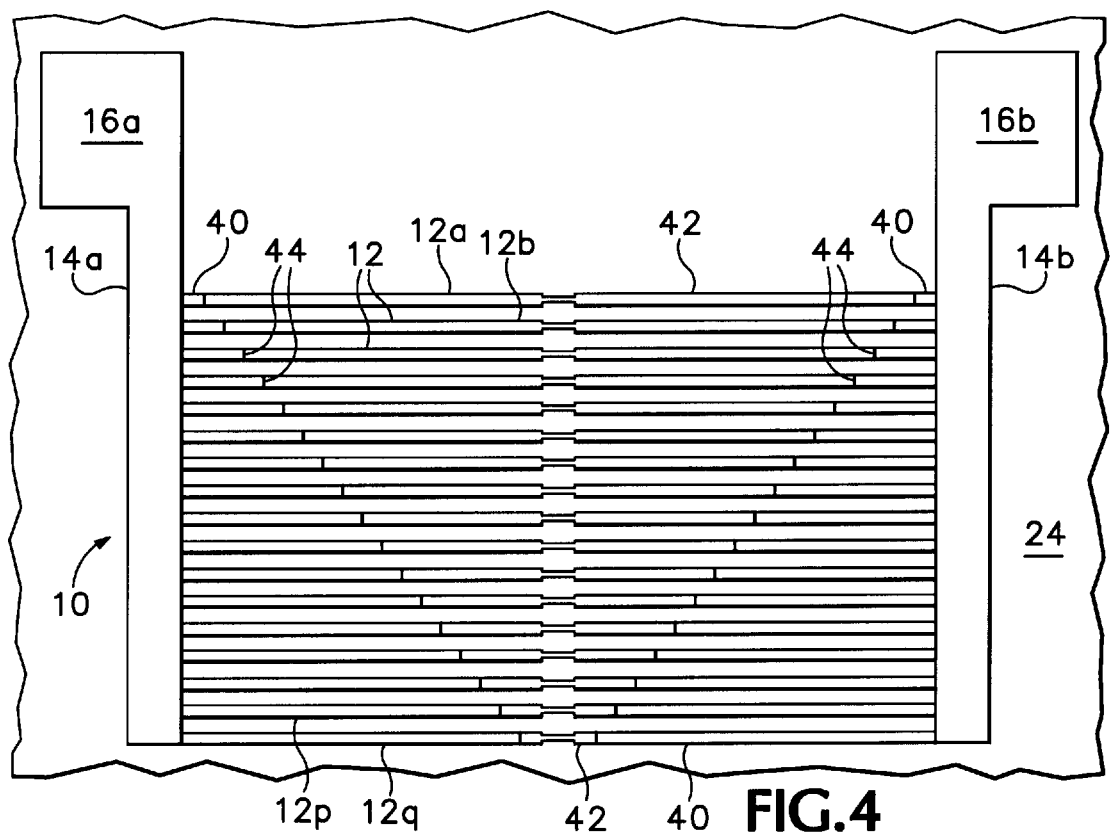
FIG. 4 is a plan view of a first preferred embodiment of a fuse array of the present invention in which proportions of highly conductive portions and relatively resistive portions vary linearly as between adjacent fusible links.
Figure 5:
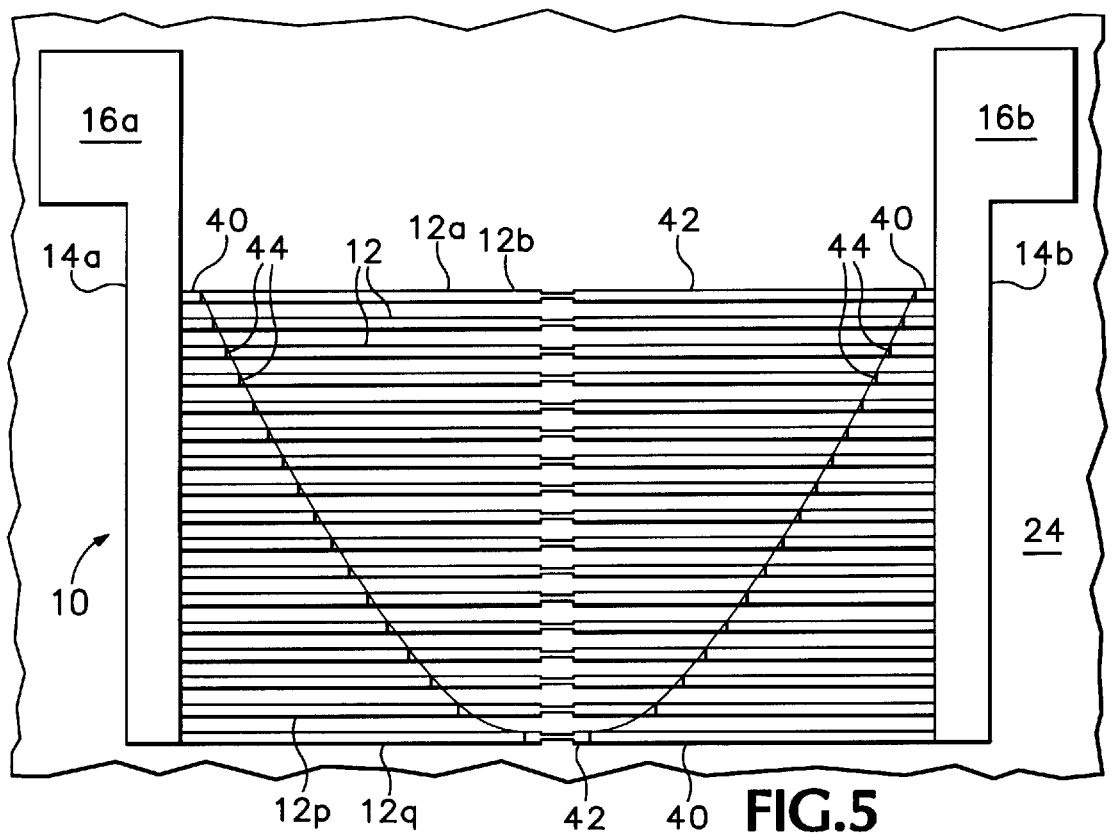
FIG. 5 is a plan view of a second preferred embodiment of the fuse array of the present invention in which proportions of highly conductive portions and relatively resistive portions vary non-linearly as between adjacent fusible links.

Preferred embodiments of the fuse array 10 are shown in FIGS. 4 and 5. These plan views depict the plurality of fusible links 12a–12q (collectively 12) coupled between pad strips 14a and 14b. Pads 16a and 16b are enlarged conductive areas at one end of each respective pad strip 14a, 14b. Preferably, the strips 14 and pads 16 are provided with a top metal layer for conductivity. The fuse array is fabricated on, or coupled to, a non-conducting substrate 24. These embodiments do not show the variable power supply or switch of the schematic representation of FIG. 1.

Figure 2:
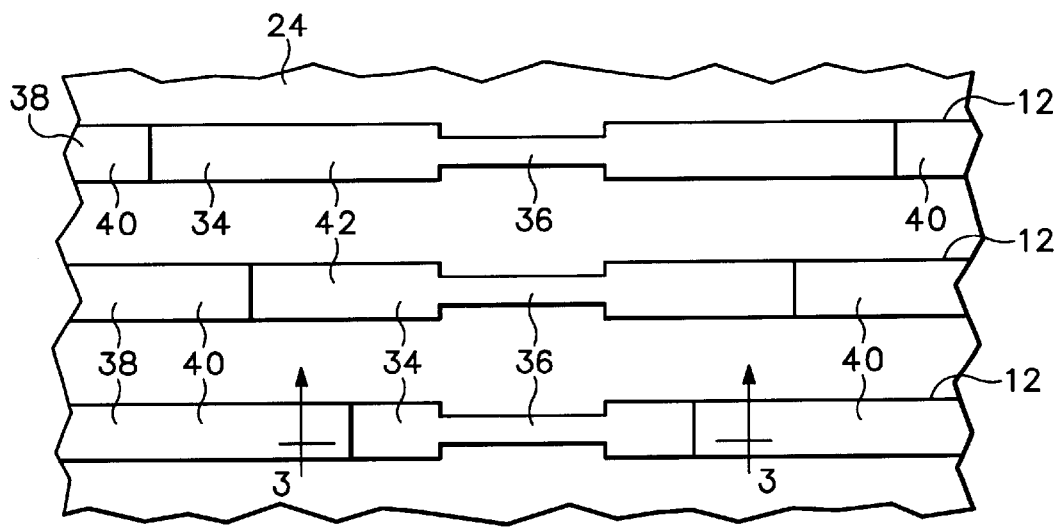
FIG. 2 is an enlarged, detailed view, shown centered on a fuse portion, of a preferred embodiment of a fusible link of the present invention.
Figure 3:
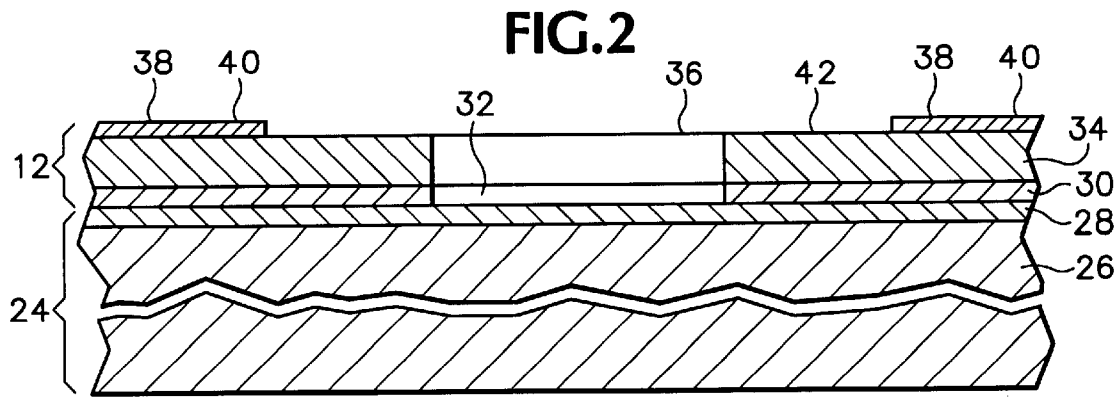
FIG. 3. is an enlarged cross section of a portion of the fusible link as seen along line 3—3 of FIG. 2.

As seen in FIGS. 4 and 5, each fusible link 12 includes segments, or portions. The segments are of unitary construction. FIG. 2 is an enlarged plan view of a middle portion of several fusible links 12. These enlarged fusible links represent fusible links located near the bottom of the plurality of fusible links of the fuse arrays of FIG. 4 or 5. FIG. 3 is a cross section of a middle portion of a fusible link as seen along line 3—3 of FIG. 2.

With particular reference to FIGS. 2 and 3, the fusible links are described with greater particularity. Exemplary fusible links 12 are elongate polysilicon beams that are rectangular in lateral cross section. Dimensions may be chosen for a particular application or performance, or to conform to a fabrication process, as in the case of MUMPs that prescribes the thickness of layers that can be applied.

The fusible links 12 are formed on a substrate wafer 26 having an electrical insulation layer 28, such as silicon nitride. The insulation layer 28 electrically insulates the fusible links from one another, and insulates the pad 16a and pad strip 14a from the pad 16b and pad strip 14b.

A thin polysilicon layer 30 is deposited onto the insulation layer 28 where the fusible links, pad and pad strips will be located. However, the thin polysilicon layer 30 is discontinuous across the length of the fusible link at a middle portion 32. Next, a relatively thicker layer 34 is formed on the thin polysilicon layer 30. The thick layer includes a necked-down portion having a thinner width that defines a fuse portion 36. The fuse portion 36 preferably overlies the discontinuity 32 of the thinner polysilicon layer 30 so that the fuse portion is suspended above the substrate 24. The fuse portion is formed so as to concentrate the location for fusing, i.e., breaking, along the length of the fusible link and to provide a design in which the fuse portion is likely to break cleanly.

Fuse portions that crack, rather then break completely, may result in a resistance increase, without providing an open circuit. This is undesirable. Rather, preferably, a fuse portion breaks quickly and completely, creating an open circuit that cannot conduct current.

The fusible links 12 further include a metal layer 38 that extends part way along the length of the fusible links. The metal layer 38 preferably extends over distal portions of the fusible links 12 and the pads 16a, 16b, and pad strips 14a, 14b. The metal layer provides a highly conductive, low resistance path for current. Polysilicon, being a semiconductor, has higher resistivity to electrical current than the metal. Polysilicon also provides greater resistance in proportion to the electrical path length.

In preferred embodiments, the resistance of each fusible link 12 is controlled by selective application of the metal layer 38. Where the metal layer is applied defines a length of a highly conductive portion 40. The portion having no metal layer is a length of uncovered polysilicon 42 that is relatively more resistive to current flow.

As noted, the metal layer 38 is discontinuous across the length of the fusible link 12 to control the resistance of the fusible link. Each fusible link includes highly conductive portions 40a–40q (collectively 40) that have the metal layer and relatively resistive portions 42a–42q (collectively 42) that do not have the metal layer thereon. In the embodiments represented in the figures, the highly conductive portions 40 having the metal layer extend from distal ends of each respective fusible link and extend toward a proximal center of the respective fusible link. The relatively resistive portions 42 are located at the proximal centers of the respective fusible link. Further, in the embodiments depicted, the fuse portion 36 is located within the relatively resistive portion 42 and at the approximate midpoint.

In the exemplary embodiments of FIGS. 4 and 5, the fusible links are arranged so that the lowest fusible links have the largest conductive portions 40 and the smallest relatively resistive portions 42. In incremental fashion, the length of the highly conductive portions 40 decrease in successively higher fusible links while the length of the relatively resistive portions 42 increases.

Accordingly, the fusible link designated 12a in FIGS. 4 and 5 has a shorter highly conductive portion 40a than the highly conductive portion 40q of the fusible link 12q. And, the relatively resistive portion 42a of the fusible link 12a is significantly longer than the relatively resistive portion 42q of the fusible link 12q. Accordingly, the fusible link 12a has a greater resistance than the fusible link 12q. Similarly, the fusible links 12b to 12p (located sequentially between fusible links 12a and 12q, but not separately numbered) increase in resistance in proportion to the lengths of their respective relatively resistive portions 42b to 42p.

In the embodiment of FIG. 4, the lengths of the relatively resistive portions 42 vary linearly. That is, the difference in lengths of the relatively resistive portions 42c and 42d of fusible links 12c and 12d is directly proportional to the difference in length of the relatively resistive portions 42d and 42e of fusible links 12d and 12e.

The effect of having a linear relationship between the resistance of adjacent fusible links 12 is that the change in equivalent resistance of the entire fuse array does not change linearly as fusible links are blown.

As stated, the fusible links are arranged in parallel. Thus, the equivalent resistance R is as described above (i.e., $R = 1/R1 + 1/R2 + 1/R3 + \ldots + 1/Rn)^{-1}$ and as each fuse is blown, the change in equivalent resistance of the fuse array increases. Thus, in the event of 15 fusible links, blowing the first fusible link will change the equivalent resistance a small amount while blowing the $14^{th}$ of 15 fusible links will change the equivalent resistance significantly more.

In a particular fuse array, the fusible link having the lowest resistance will blow first and the fusible link having the penultimate lowest resistance with blow second and so on until the fusible link having the greatest resistance will blow last. In this sequence, blowing the first fusible link will have a small effect on the equivalent resistance while blowing the penultimate fusible link will have a significantly greater effect on the equivalent resistance.

The process of customizing the fuse array by blowing fusible links may be improved for particular applications by modifying the fusible link design so that the change in equivalent resistance is substantially linear as each fusible link is blown. In general, linearizing the change in equivalent resistance requires that the difference in resistance between adjacent fusible links become smaller towards the end of the sequence of blowing fusible links.

In the embodiments of FIGS. 4 and 5, the fusible link 12q would blow first and the fusible link 12a would blow last. In the embodiment of FIG. 4, because the resistance of the fusible links changes linearly from one fusible link in the sequence to the next fusible link in the sequence, the change in equivalent resistance of the fuse array does not change linearly. This can pose a problem of controlling the process of tuning the fuse array to create a desired property.

In the embodiment of FIG. 5, the difference in resistance between successive fusible links 12 is not linear. The difference in resistance between a pair of fusible links near the beginning of the sequence of blown fusible links is reater than the difference in resistance between a pair of fusible links near the end of the blown sequence. Specifically, with reference to FIG. 5, the difference in resistance between fusible links 12q and 12p is greater than the difference in resistance between fusible links 12b and 12a. The intervening fusible links have a similar relationship in their respective differences in resistance.

The amount of the differences between the resistance of successive fusible links in the blown-order sequence is selected so as to make substantially linear, the change in equivalent resistance of the fuse array as fusible links are blown. The embodiment of FIG. 5 uses a parabolic relationship between the lengths of the relatively resistive portions 42a–42q. In viewing FIG. 5, demarcations 44 between the relatively resistive portions 42 and the highly conductive portions 40 substantially traces a parabolic curve. Thus, the demarcations 44 between fusible links 12a and 12b are relatively close and the demarcations 44 between fusible links 12p and 12q are relatively further apart.

In contrast, the demarcations 44 of the embodiment of FIG. 4 are equally spaced apart as between fusible links 12p and 12q at the beginning of the blown fuse sequence and the fusible links 12a and 12b at the end of the sequence. However, as the number of blown fusible links increases, each successive fusible link that is blown has an increasingly greater effect on the equivalent resistance.

Stated differently, the relationship of the equivalent resistance R to the number of blown fuses may be nonlinear as would occur in the embodiment of FIG. 4 or substantially linear as would desirably occur in the embodiment of FIG. 5. Additionally, other embodiments may be employed in which the difference in resistance between adjacent fusible links is adjusted so that the relationship of R versus the number of blown fusible links is quadratic, logarithmic, or exponential.

In preferred embodiments that are fabricated by the MUMPs process, the metal layer can reduce the resistivity by a factor of 400. Thus, a polysilicon structure without a metal layer has 400 times the resistance to current than an equivalent size and shape polysilicon structure having a metal layer thereon. In preferred MUMPs fabricated embodiments, the metal layer is CrAu at 0.6 $\mu$m thickness. In alternative embodiments fabricated by other means, any deposited silicon layer, amorphous or polysilicon, can be heavily doped to provide a resistance very similar to metals. Very highly doped silicon can be more conductive than some metals.

Alternative Embodiments of the Fuse Array

The preferred embodiments of the fuse array described above include the cross section of FIG. 3 wherein the fusible links are fabricated as a thin polysilicon layer 30, a relatively thicker polysilicon layer 34, and a metal layer 38. In alternative embodiments, the fusible links may be fabricated as a single polysilicon layer that sits directly on top of the insulation layer 28, and a metal layer on top of the polysilicon. Alternatively, the difference in resistance between the fusible links may be created by selective doping or material blends, rather than by the metal layer 38.

If the fuse array of the present invention is fabricated on a non-conductive material, the insulation layer 28 of the described embodiments would be superfluous.

In the embodiments described above, the fuse portion is suspended above the substrate 24 to facilitate a clean break when the fuse is intentionally blown to tune the fuse array. Alternatively, the fuse portion could rest directly on the substrate and perform its intended function. Other fuse portion configurations may also be suitable.

The layers, substrate, and many physical parameters of the described embodiments are chosen to conform the requirements of the MUMPs fabrication process. Other fabrication processes, particularly custom processes, may dictate, or allow, designs that can not be accomplished by the MUMPs process.

The above descriptions refer to polysilicon fusible links and using a metal layer to control the current (and, hence the ohmic heating) through each fusible link. An alternative embodiment may use CMOS technology to allow more precise current control through selective doping. In other embodiments, a fuse array may be entirely fabricated of metal. In this later embodiment, a geometry of the fusible links can be tailored to determine current flow through the link.

The embodiments shown in FIGS. 2–5 have highly conductive portions 40 symmetrically disposed at distal regions of each fusible link 12. Likewise the relatively resistive portions 42 are symmetrically disposed about the middle of the fusible link and just inside the highly conductive portions 40. Further, the fuse portions 36 are positioned approximately at a midpoint of each fusible link. However, in alternative embodiments, the portions may be positioned as desired for fabrication ease, functional considerations, or to address space considerations in the circuit or structure in which the fuse array is deployed.

For example, although the present embodiments show parallel pad strips 14a and 14b, the pad strips may be oriented obliquely or orthogonally and the fusible links arranged as circle segments that extend from one pad strip to the other. In such an embodiment, the polysilicon fusible links would have different lengths that would create different resistances and distinct highly conductive portions may not be needed.

In other embodiments, the fuse portions may be arranged adjacent one of the pad strips 14a or 14b and the relatively resistive portions 42 and the highly conductive portions 40 would extend from the fuse portion to the other pad strip.

In another preferred embodiment, a fuse array 10' of the present invention is vertically arranged as shown in FIGS.

10 and 11. An advantage of the vertically arranged fuse array 10', is its smaller "footprint," that is, this embodiment uses substantially less area on its supporting surface as compared to the fuse array embodiments of FIGS. 4 and 5.

In this embodiment, the vertically arranged fuse array 10' includes a lower portion 50, which is fabricated on a wafer or substrate 52, and an upper portion 54 that is formed above, and spaced apart from, the lower portion, as best seen in the cross-section view of FIG. 11. The upper and lower portions 54, 50 are joined, electrically and mechanically, by pillars 56a–56c (collectively 56), which function as fuses. A metal layer 58 is located along portions of the upper portion 54.

The upper and lower portions 54, 50 each comprise respective conducting strips 60, 62, and respective projecting fingers 64a–64c and 66a–66c (collectively 64 and 66, respectively). Each conducting strip 60, 62 terminates in a respective conducting pad 70, 72. Functionally, the fingers 64, 66 and pillars 56 are similar to the fusible links 12 of the embodiments of FIGS. 4 and 5.

The metal layer 58 is provided with different lengths along the respective fingers 64 of the upper portion 54 to provide different conductivity among the fingers. Thus, in the exemplary embodiment of FIG. 10, the uppermost finger 64a is more conductive than the lowermost finger 64c because finger 64a has a longer length of the metal layer.

As in the previous embodiments, a switched voltage may be applied across the conducting pads 70 and 72 to induce a current through the strips 60 and 62, the respective fingers 64a–64c and 66a–66c, and pillars 56a–56c. The finger 64a has the longest length of metal layer 58 and thus conducts the most current—all other current limiting factors being substantially equal. The pillar 56a will experience the most ohmic heating and will fuse first. As soon as the first pillar fuses, the resistance across the conductive pads 70 and 72 increases and no more pillars fuse unless the voltage is increased. Accordingly, the vertically arranged fuse array of FIGS. 10 and 11 is operationally similar to the fuse array embodiments described above.

The embodiment of FIGS. 10 and 11 are exemplary. Other embodiments of vertically arranged fuse arrays may include additional structure to support the conductive strip 60 of the upper portion so that it remains suspended even if all the pillars 56 are fused. For example, support structure may be formed at an upper end 74 of the upper conductive strip 60. Also, support structures that reach down to the wafer 52 may be formed at distal ends 76a–76c (collectively 76) of the upper fingers 64a–64c.

Alternatively, the fingers 64a–64c may be formed on the wafer 52 between the fingers 66a–66c and the upper conducting strip 60 would then pass over the fingers 66a–66c of the lower portion 50 and couple to the fingers 64a 64c. The pillars 56 would not be necessary at the distal ends 76 because the fingers 64 and 66 are horizontally adjacent in this embodiment. Thus, fuse portions, similar to the embodiments of FIGS. 4 and 5, may be formed on the wafer 52 between distal ends of the respective fingers 64 and. 66.

Additionally, the upper and lower portions 50, 54 of the embodiments of the vertically arranged fuse arrays need not be separated by air/space. A dielectric may be formed on the lower portion 50 and the upper portion 54 may then be formed on the dielectric and the pillars 56 or supporting structure (not shown) are located in vias formed in the dielectric.

In the MUMPs fabrication process referenced above, the separation between the upper and lower portions 54, 50 is achieved by a sacrificial layer laid over the lower portion and the sacrificial layer is removed after forming the upper portion. The pillars 56 are formed in vias that are etched into the sacrificial layer.

The fuse portions need not be straight, or have rectangular cross sections in any of the embodiments. The fuse portions may be modified to have cross sections that dissipate more or less heat depending on the circuit parameters and the means used to customized the fuse array. Further, the fuse portions may have particular configurations to facilitate a clean break, such as score lines at one or two locations. Such alternative embodiments are particularly suitable in the context of fuse beams that must break cleanly and be physically separated a sufficient distance to permit moving masses to move without interference from the fusible links that have been blown.

Operational Considerations

In the exemplary description of FIG. 1, the fuses are blown by a voltage provided by the voltage supply 20. The voltage may be more aptly characterized as voltage pulses that are applied to the electrodes at a particular amplitude and duration. The fuses are blown by heat H that is generated by the current in proportion to the resistance ($H=I^2Rt$). The heat generated in the fuse may be controlled by the voltage amplitude or the duration of the voltage pulses.

Constant voltage sources are preferable. If the power source were a constant current source, control of the process to adjust the fuse array would be difficult because the equivalent resistance across the fuse array increases after each fuse is blown. A constant current source would increase the current in each remaining link as the equivalent resistance drops, possibly blowing successive fusible links.

In addition, the design of the fusible links can also control heat dissipation. A square cross-section is relatively poor at dissipating heat while a thin rectangular cross-section is relatively better at dissipating heat. Fusible links that dissipate heat efficiently would require a different voltage profile to blow a fusible link than one that dissipates heat poorly.

The fusible links may be blown by controlled application of voltage pulses. Preferably, the voltage pulse is monitored to track the fuses being blown and the resulting equivalent resistance across the fuse array. In preferred embodiments, the equivalent resistance across the fuse array will show a step-wise increase in resistance as individual fusible links are blown. Also, looking for a discontinuity in the current during the voltage pulse will also indicate the successful blowing of a link. With knowledge of the design of the fuse array, the equivalent resistance will provide feedback as to the remaining structure after a given series of voltage pulses. Using empirical test results and knowledge of the fuse array design, preprogrammed sequences of voltage pulses may be stored in computer memory and applied to an individual fuse array to create a desired result.

Mechanical Resonators and Filters

Figure 6:
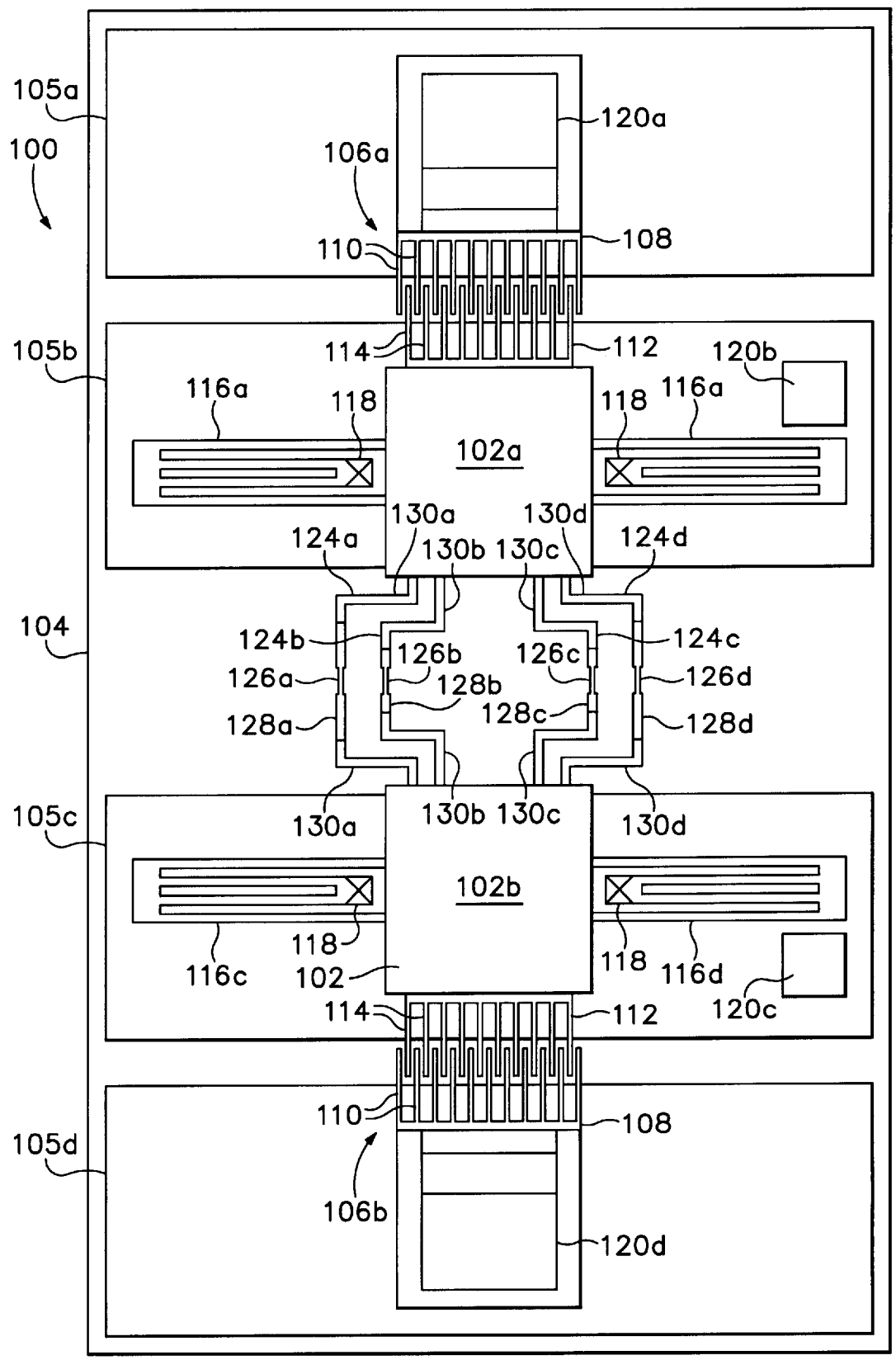
FIG. 6 is a plan view of a first exemplary MEMS resonator having a fuse array of the present invention.
Figure 7:
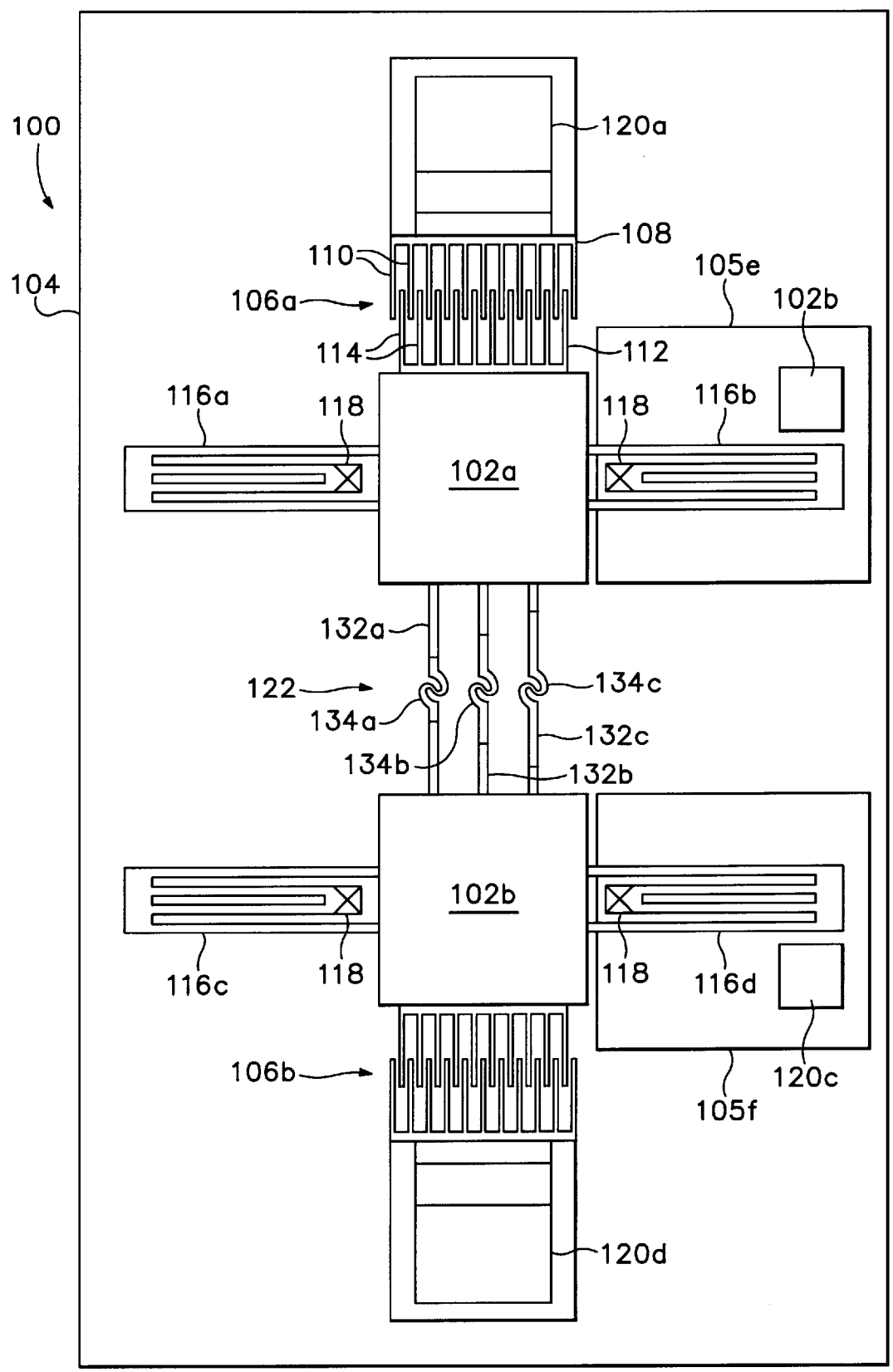
FIG. 7 is a plan view of a second exemplary MEMS resonator having a fuse array of the present invention.
Figure 8:
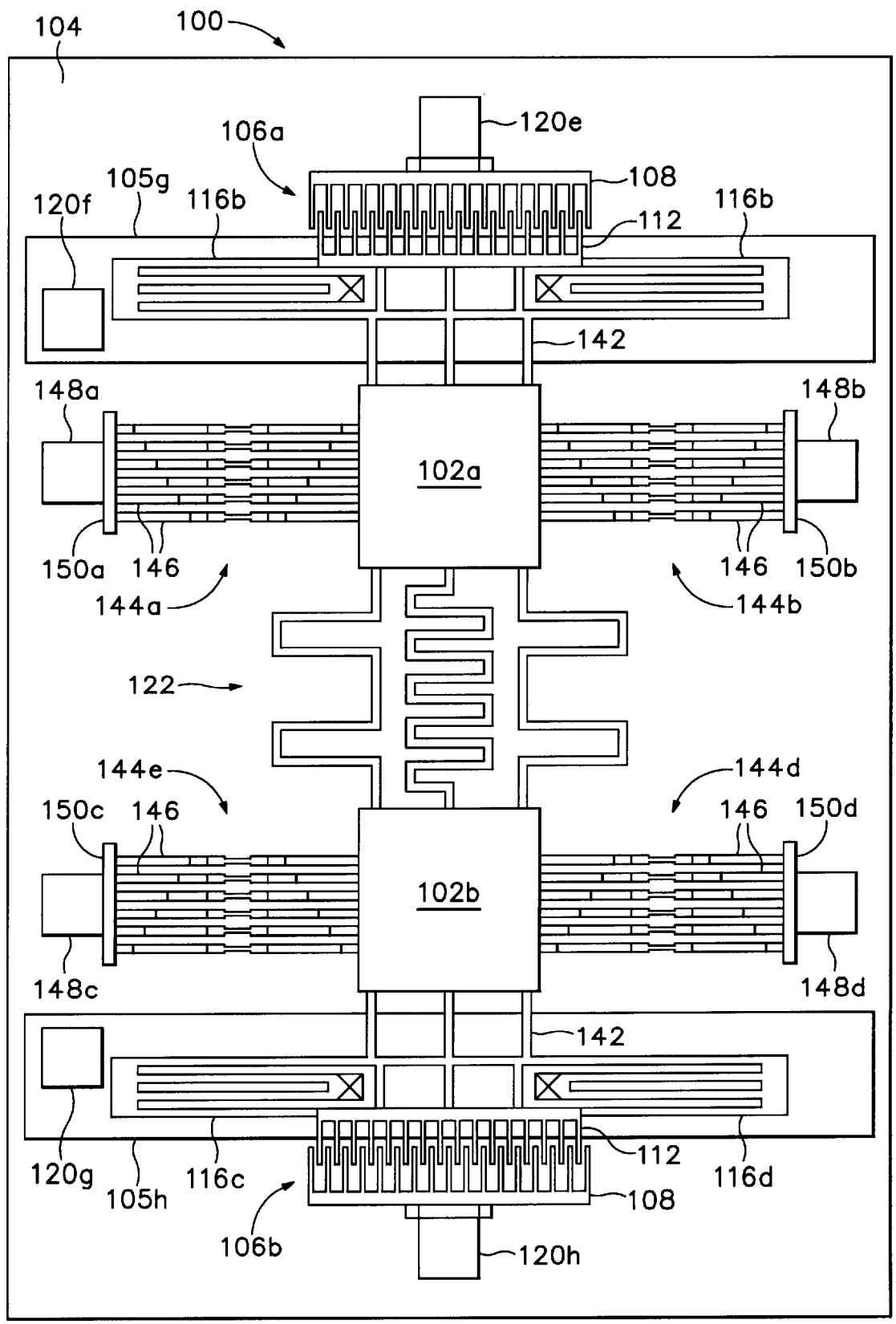
FIG. 8 is a plan view of third exemplary MEMS resonator having a fuse array of the present invention.

In FIGS. 6–8, the present invention is shown applied to different embodiments of resonators 100. In each exemplary embodiment of FIGS. 6–8, the resonators are two mass 102a and 102b (collectively 102) resonators resting on substrates 104, or conductive regions 105, and driven by electrostatic comb drives 106a and 106b (collectively 106).

General designs and uses of single and multiple mass resonators are known in the art. Such resonators may be used for mechanical filters, as sensors, and in other applications.

The present invention improves such resonators by providing a means to permanently tune a general purpose resonator for a particular use. In contrast to prior art tunable resonators, the resonators of the present invention do not require constant power to maintain or provide damping, and therefore can have substantially higher quality factors (Q) in operation.

With reference to the exemplary resonator embodiments of FIGS. 6–8, each resonator includes comb drives 106. The comb drives may be used to excite the masses 102, or as transducers to convert the motion of a mass 102 into electrical signals. Comb drives are known in the art, but summarized here for clarity.

Each exemplary comb drive 106 includes a first comb 108 that is fixed to its supporting surface. The first comb 108 includes projecting fingers 110. A second comb 112, also having projecting fingers 114, is arranged so that the fingers 110, 114 of the first and second combs are interdigitated. The second comb is not fixed to its supporting surface, but is free to move. Bias members 116 are provided to hold the second comb 112 in place for interaction with the first comb 108. In the embodiments of FIGS. 6 and 7, the bias members 116 are coupled to a mass 102, that is, in turn, coupled to the second comb 112.

When a potential voltage is applied across the first and second combs, an electrostatic force is generated between the first and second combs that urges the second comb toward the first comb. This electrostatic force is used to drive the masses. Alternatively, if the first and second combs are moved toward each other by external forces, a change in the capacitance across the first and second combs may be measured to sense the motion of a mass coupled to the second comb.

FIG. 6 discloses a two mass resonator located on a non-conducting substrate 104. On top of the substrate and below the structure of the resonator 100, conducting regions 105a–105d are formed by a layer of conducting material such as polysilicon. The conducting regions allow potential differences to be established between portions of the resonator 100 and between portions of the fuse arrays for purposes of operating the comb drives 106 and blowing fuses, as described below.

The bias members 116a, 116b, 116c, and 116d (collectively 116) are folded spring bias members that are coupled to respective masses 102 and anchored to the top of the conducting regions 105 at respective anchors 118. The bias members control the movement of the masses 102 so that the mass moves only in the plane of the substrate and will not twist. If twisting occurs, the second comb could become jammed on the first comb and cease to operate properly.

The bias members 116 also bias a respective mass 102 into a neutral, or relaxed, position. When a comb drive is actuated to move a mass, or a mass is moved by acceleration or other outside force, the bias members must yield to permit the mass to move relative to the substrate. When the force on the mass subsides, the bias members urge the mass to return to the neutral position.

Also, the bias members 116 are preferably electrically conductive to provide an electrical path for voltage pulses that may be used to blow fuse beams.

Electrical pads 120a–120d (collectively 120) are provided on respective conducting regions 105a–105d to connect to outside voltage sources (not shown). By locating the electrical pads 120a–120d on separate conducting regions 1050a–105d, the electrical pads are electrically separate from each other, but are in electrical connection with anchored portions of the resonator 10 on the same conducting region. Thus, pad 120a is electrically coupled to the first comb 108 of the upper comb drive 106a, pad 120b is electrically coupled to the bias members 116a and 116b on the conductive region 105b via the anchors 118, the pad 120c is similarly coupled to the bias members 116c and 116d on conductive region 105c, and pad 120d is electrically coupled to the first comb of the lower comb drive 116b. Other configurations of conductive regions are suitable for the application and operation described herein.

Mechanical couplers 122 are coupled to the masses 102 and define a dynamic relationship between the masses. In FIG. 6, the couplers 122 are fuse beams 124a, 124b, 124c, and 124d (collectively 124) having fuse portions 126a, 126b, 126c, 126d, relatively resistive portions 128a, 128b, 128c, 128d, and highly conductive portions 130a, 130b, 130c, 130d. The fuse beams 124 are configured to provide an elastic connection between the masses 102. The exemplary embodiment of FIG. 6 shows four fuse beams 124, arranged in symmetric pairs. Preferred embodiments may include many more such fuse beams, and fuse beams having different arrangements.

With particular reference to FIG. 6, the fuse beams 124a and 124d are mirror-image symmetrical about a centerline (not shown) extending between midpoints of the masses 102. Each of these fuse beams 124a and 124d have substantially similar arrangements of their respective portions, i.e., the fuse portions 126a, 126d, relatively resistive portions 128a, 128d, and highly conductive portions 130a, 130d.

Similarly, the fuse beams 124b and 124c are substantially mirror-image symmetrical about the centerline referenced above and their respective portions 126b and 126c, 128b and 128c, and 130b and 130c are substantially similar.

Incorporating the teachings of the fuse array of the present invention, as described in detail above, the fuse beams may be blown by the application of voltage pulses applied across their lengths. In FIG. 6, a voltage potential may be established across the pads 120b and 120c. Current flowing between these pads would follow a path through the bias members 116a and 116b, the mass 102a, the fuse beams 124, the mass 102b, and the bias members 116c and 116d.

In this embodiment of FIG. 6, the fuse beams 124b and 124c are depicted as having the smaller lengths of relatively resistive portions 128b, 128c than do the fuse beams 124a and 124d. Accordingly, because the fuse beams 124b and 124c are most conductive, their respective fuse portions 126b and 126c will blow before the fuse portions 126a and 126d of the fuse beams 124a and 124d, respectively. By blowing the fuse beams 124b and 124c, the dynamic relationship between the masses 102 is modified.

If many pairs of fuse beams are provided, many increments of voltages may be applied to provide incremental differences in the dynamic relationship between the masses 102. When a voltage is used to blow a pair of fuse beams simultaneously, a current instability may occur at the instant a first one of the fuse beam pair blows that may interfere with blowing the second fuse of the pair. Thus, preferably, the voltage is applied twice to insure that both fuses of a fuse pair have blown. Alternatively, long voltage pulses may be applied so as to blow both fuse beams of a fuse beam pair.

In FIG. 7, masses 102a and 102b are again coupled by couplers 122 comprising exemplary fuse beams 132a, 132b, and 132c (collectively 132). In this embodiment, the fuse beams include convolute fuse portions 134a, 134b, and 134c (collectively 134). In the event of fuse beams having straight fuse portions, such as fuse beams 124, a blown fuse may present a problem by butting broken ends as the masses 102 move relative to one another. Such butting interference may by avoided by the use of the convolute fuse portions 134.

FIG. 9 shows an enlarged detail view of one fuse portion 134. In this embodiment, when the fuse portion 134 blows, the thinnest region is most likely to break. By having the fuse portion convolute, shaped as a junction of two shepherd's crooks joined at their ends, the fuse beams will not interfere with one another when the fuse portion is blown and the masses move. As can be seen in FIG. 9, when the fuse portion 134 is blown, the respective, now separate portions of the fuse beam 132, can move some distance without contacting one another, even if the amount of the fuse portion 134 that is blown away is very small. Other convolute configurations may also be suitable.

In addition, preferred embodiments may offset straight portions (e.g., 136a and 136b of FIG. 9) of the fuse beams to further assist in reducing possible interference of a blown fuse beam with the motion of the masses 102. Offsetting the straight portions means that longitudinal axes of the respective straight portions 136 of the fuse beams are not aligned.

The fuse beams of the embodiment of FIG. 7 operate substantially as described above. That is, each fuse beam 132a, 132b, 132c includes highly conductive portions (not separately numbered) and relatively resistive portions (not separately numbered) that are arranged so as to provide different resistance values in the respective fuse beams 132. Thus, voltage pulses may be applied across the fuse beams to blow a desired number of fuse beams to achieve a desired response as between the masses 102.

A third embodiment is shown in FIG. 8. This embodiment includes the comb drives 106a and 106b and the masses 102a and 102b as described above in connection with other embodiments. In this embodiment, however, the coupler 122, located between the masses 102 does not include fuse portions. Rather, the coupler 122 is shown fixedly coupled to the masses in an exemplary configuration.

Bias members 116a–116d are coupled between conductive regions 105g and 105h and a frame 142. The frame 142 is also fixedly coupled to the second combs 112 of respective comb drives 106a and 106b and the respective masses 102a and 102b. Electrical pads 102f and 120g are also located on the conductive regions 105g and 105h, respectively and are in electrical communication with the bias members via respective conductive regions 105. As in the above embodiments, the bias members 116 are conductive.

Electrical input pads 120e and 120h are coupled to the first combs 108 for driving the respective comb drives 106a and 106b.

Each respective mass 102 is constrained in movement by the coupler 122, respective bias members 116, and fuse beam arrays 144a, 144b, 144c, and 144d collectively 144). The fuse beam arrays 144 are each comprised of a plurality of fuse beams 146 (not all beams are numbered) wherein each fuse beam includes highly conductive portions, relatively resistive portions, and a fuse portion (not separately numbered), substantially as described above in connection with the fuse arrays of FIGS. 4 and 5. Pads 148a–148d are coupled to one end of each respective fuse beam array 144a–144d to provide a location for applying a voltage source.

As in the embodiments of FIGS. 6 and 7, the masses 102a and 102b are separated from the substrate 104 and can move relative to the substrate. In order to permit movement of the masses 102, the fuse beam arrays 144 are separated from the substrate 104 on which they are formed. Preferably, the fuse beams 144 are fixedly coupled to respective piers 150a–150d and the piers are fixedly coupled to the substrate. Thus, the fuse beams provide a bias force to the masses.

The fuse beams 146 of the fuse beam array may be tuned as described above in connection with the fuse arrays of FIGS. 4 and 5. That is, a voltage pulse may be applied at the pads to create a voltage potential across the fuse beams that induces a current to flow through the fuse beams. For example, to blow fuse beams in the fuse beam array 144a, a voltage potential may be applied across the pad 148a and 120f. Similarly, to blow fuse beams in fuse beam array 144d, a potential voltage may be applied across the pads 148d and 120g.

Fuse beams 146 may be blown by inducing a current of sufficient amperage so that sufficient heat is generated at the fuse portion to cause the fuse portion to fuse. In this embodiment, the fuse beams may be addressed and blown substantially as in the fuse array embodiments of FIGS. 4 and 5.

As stated, in this embodiment the fuse beams act as bias members and constrain motion of the masses 102. By blowing fuse beams, the fuse array provides less resistance to motion of the masses 102. Accordingly, the fuse beam array can be tuned to provide a desired response for the masses 102 and hence, the resonator 100.

Exemplary embodiments of resonators 100 have been shown and described. However, the fuse array of the present invention may be incorporated into other embodiments of resonators. Accordingly, the fuse array of the present invention may be incorporated into resonators having a single mass, or having more than two masses. The fuse array may be used to tune the coupling between masses or to tune bias force elements that act on the masses or second combs. Drives other than comb drives may be used to move the masses. The resonators may be fabricated as a single layer, or multiple layers, in a MEMS fabrication process. The fuse beams may be polysilicon, or another material so long as the fuse beams may be provided with different resistances, and fuse portions that fuse when the fuse portions reach a predetermine temperature.

The fuse beams may have different resistances by virtue of lengths of resistive materials, lengths of highly conducive layers, selective doping, other impurities or dielectrics, or any combination of the above. Other means of creating resistance variations may also be developed and if used in combination with the elements of a claim defining the invention would constitute an embodiment of the invention.

The voltage used to blow fuse beams may be pulses or steady state. The voltage potential may use ground, or any other voltage, as a common terminal. The voltage may be applied across one, two or more than two fuse beams simultaneously.

This specification sets forth the best mode for carrying out the invention as known at the time of filing the patent application and provides sufficient information to enable a person skilled in the art to make and use the invention. The specification further describes materials, shapes, configurations and arrangements of parts for making and using the invention. However, it is intended that the scope of the invention shall be limited only by the language of the claims and the law of the land as pertains to valid U.S. patents.

What is claimed is:

1. A fuse array, comprising:

first and second fusible links that have first and second resistances, respectively, wherein the first resistance is less than the second resistance, and the first and second fusible links have respective first and second fuse portions; and first and second electrical pads electrically coupled to the first and second fusible links, and wherein a first voltage potential difference across the first and second pads causes a first electrical current to be conducted in the first fusible link and a second electrical current to be conducted in the second fusible link, such that the first fuse portion of the first fusible link fuses.

2. The fuse array of claim 1 wherein a second voltage potential across the first and second electrical pads causes the second fuse portion of the second fusible link to fuse.

3. The fuse array of claim 1 further comprising a third fusible link that is electrically coupled to the first and second electrical pads, the third fusible link having a third resistance and a third fuse portion, and wherein the third resistance is greater than the second resistance and wherein a third voltage potential causes the third fuse portion of the third fusible link to fuse.

4. The fuse array of claim 3 wherein the difference in resistance between the first and second resistances is substantially equal to the difference in resistance between the second and third resistances.

5. The fuse array of claim 3 wherein the difference in resistance between the first and second resistances is not equal to the difference in resistance between the second and third resistances.

6. The fuse array of claim 1 further comprising a substrate and wherein the first pad is fixed coupled to a substrate and the first and second fusible links are fixedly coupled to the first pad and wherein the second pad is a mass coupled to the first and second fusible links and is not fixedly coupled to the substrate.

7. The fuse array of claim 1 wherein the first pad is a mass and the second pad is a mass and the first and second fusible links are fixedly coupled the first and second pads and moving the first pad induces forces in the first and second fusible links and the first and second fusible links transfer forces to the second pad and fusing the fuse portion of the first fusible link changes the forces transferred to the second pad when the first pad is moved.

8. The fuse array of claim 1, further comprising a first electrostatic comb drive that moves the first pad and wherein the first and second fusible links transfer forces from the first pad to the second pad when the first comb drive moves the first pad and wherein fusing the fuse portion of the first fusible link alters the transfer of forces from the first pad to the second pad when the comb drive moves the first pad.

9. The fuse array of claim 1 further comprising a substrate and a mass, and wherein the mass can move relative to the substrate when outside forces act on the mass, and wherein the first and second pads are fixedly coupled to the substrate and the mass is fixedly coupled to the first and second fusible links such that the outside force induces a first motion to the mass when neither fuse portion is fused and the outside force induces a second motion when the first fuse portion is fused.

10. A fuse array, comprising:

first and second fusible links that have first and second resistances, respectively, wherein the first resistance is less than the second resistance, and the first and second fusible links have respective first and second fuse portions; and first and second electrical pads electrically coupled to the first and second fusible links, and wherein a first voltage potential difference across the first and second pads causes a first electrical current to be conducted in the first fusible link and a second electrical current to be conducted in the second fusible link, such that the first fuse portion of the first fusible link fuses;

wherein the first and second fusible links each comprise a first portion having a first conductivity and a second portion having a second conductivity wherein the first conductivity is greater than the second conductivity, and wherein the second portion of the first fusible link is shorter than the second portion of the second fusible link.

11. The fuse array of claim 10 wherein the first and second portions are doped semiconductors.

12. The fuse array of claim 10 wherein the first portion of the first and second fusible links includes a metallic layer.

13. The fuse array of claim 10 wherein the second portion of the first and second fusible links comprises a polysilicon semiconductor.

14. The fuse array of claim 10 wherein the first portion of the first and second fusible links comprises a polysilicon semiconductor having a metallic portion along a length thereof, and the second portion of the first and second fusible links comprises a polysilicon semiconductor having no metallic portion thereon.

15. An addressable fuse array, comprising:

a first electrically conductive electrode;

a second electrically conductive electrode;

a first fusible link coupled to the first and second electrodes, the first fusible link having a first resistance;

a second fusible link coupled to the first and second electrodes, the second fusible link having a second resistance wherein the second resistance is greater than the first resistance;

whereby a voltage potential applied across the first and second electrodes induces a current in the first and second fusible links and at a first voltage potential the first fusible link becomes non-conducting and the second fusible link remains conducting.

16. The addressable fuse array of claim 15 further comprising a third fusible link coupled to the first and second electrodes, the third fusible link have a third resistance that is greater than the second resistance.

17. The addressable fuse array of claim 16 wherein the difference in resistance between the second resistance and the first resistance is substantially equal to the difference in resistance between the third resistance and the second resistance.

18. The programmable fuse array of claim 16 wherein the difference in resistance between the second resistance and the first resistance is not equal to the difference in resistance between the third resistance and the second resistance.

19. The addressable fuse array of claim 16 wherein at a second voltage potential the second fusible link becomes non-conducting and the third fusible link remains conducting.

20. The addressable fuse array of claim 15 wherein the first and second fusible links each comprise a highly conductive portion and a relatively resistive portion and the length of the relatively resistive portion of the first fusible link is longer than the relatively resistive portion of the second fusible link thereby making the first resistance to be less than the second resistance.

21. The addressable fuse array of claim 20 wherein the highly conductive portions include a strip of conductive metal.

22. The addressable fuse array of claim 15 wherein the first and second fusible links each include a fuse portion and the first voltage potential fuses the fuse portion of the first fusible link.

23. The addressable fuse array of claim 22 further comprising a substrate and wherein the first and second fusible links are supported by the substrate and the fuse portions are suspended above the substrate.

24. The addressable fuse array of claim 22 wherein the fuse portions are convolute.

25. The addressable fuse array of claim 22 wherein the first and second fusible links are symmetrical about a centerline and a left portion of each respective first and second fusible link is located to a left side of the centerline and a right portion of each respective first and second fusible link is located to a right side of the centerline and the left and right portions include elongate portions that terminate in a crook and the left portion is coupled to the right portion at their respective crooks and the first and second fuse portions are the respective coupled crooks.

26. A resonator having a first movable mass wherein the addressable fuse array of claim 15 is coupled to the mass so as to apply a bias force to the mass when the mass moves and wherein the application of the first voltage potential across the first and second electrodes makes the first fusible link non-conducting and lessens the bias force applied to the mass when the mass moves.

27. A resonator having first and second movable masses and wherein the addressable fuse array of claim 15 is coupled to the first and second movable masses so as to transmit coupling forces from the first mass to the second mass when the first mass moves, and wherein making the first fusible link non-conducting lessens the coupling force that is transmitted from the first mass to the second mass when the first mass moves.

28. An addressable fuse array, comprising:
 a first electrical conductor;
 a second electrical conductor;
 a first fusible link coupled to the first and second conductors, the first fusible link comprising a first portion having a first resistance and a length L1, a second portion having a second resistance and a length of length L2, and a third portion, and wherein the first resistance is less than the second resistance; and
 a second fusible link coupled to the first and second conductors, the second fusible link comprising a first portion having the first resistance and having a length L3, a second portion having the second resistance and having a length L4, and a third portion;
 wherein the length L1 is not equal to the length L3 and the length L2 is not equal to the length L4 thereby making the first fusible link more conductive than the second fusible link, so that a first applied voltage across the first and second electrical conductors causes an electrical current in the first and second fusible links that induces a first ohmic heat in the first fusible link that fuses the third portion of the first fusible link.

29. The addressable fuse array of claim 28 further including a substrate and a mass that is movable relative to the substrate, and wherein the first and second fusible links have a first end coupled to the mass and a second end coupled to the substrate and the first and second fusible links apply a first bias force to the mass when the mass moves and after the first fusible link fuses, the second fusible link applies a second bias force to the mass when the mass moves.

30. The addressable fuse array of claim 28 further including a first and a second mass and wherein the first and second fusible links have a first end coupled to the first mass and a second end coupled to the second mass such that when the first mass moves the first and second fusible links apply a first coupling force to the second mass before the first fusible link is fused and the second fusible link applies a second coupling force to the second mass after the first fusible link is fused.

31. The addressable fuse array of claim 28 wherein the respective first portions of the first and second fusible links includes a metallic strip thereon.

32. The addressable fuse array of claim 28, wherein a centerline is defined as extending laterally through the first fusible link and the second fusible link at an approximate longitudinal midpoint of the first and second fusible links, and wherein the respective first portions of the first and second fusible links comprise a left first portion and a right first portion that are located on respective left and right sides of the centerline.

33. The addressable fuse array of claim 28, wherein a centerline is defined as extending laterally through the first fusible link and the second fusible link at an approximate longitudinal midpoint of the first and second fusible links, and wherein the respective second portions of the first and second fusible links comprise a left second portion and a right second portion that are located on respective left and right sides of the centerline.

34. The addressable fuse array of claim 28, wherein a centerline is defined as extending laterally through the first fusible link and the second fusible link at an approximate longitudinal midpoint of the first and second fusible links, and wherein the respective third portions of the first and second fusible links are located along the centerline.

35. The addressable fuse array of claim 28 further comprising a third fusible link including a first portion having the first resistance and having a length L5, and a second portion having the second resistance and having a length L6, and a third portion.

36. The addressable fuse array of claim 35 wherein a second applied voltage across the first and second electrical conductors after the first fusible links is fused causes an electrical current in the second and third fusible links that induces a second ohmic heat in the second fusible link that fuses the third portion of the second fusible link.

37. The addressable fuse array of claim 35 wherein the difference between the lengths L1 and L3 is substantially the same as the difference between the lengths L3 and L5.

38. The addressable fuse array of claim 35 wherein the difference between the lengths L1 and L3 is not equal to the difference between the lengths L3 and L5.

39. The addressable fuse array of claim 35 wherein the difference between the lengths L2 and L4 is substantially the same as the difference between the lengths L4 and L6.

40. The addressable fuse array of claim 35 wherein the difference between the lengths L2 and L4 is not equal to the difference between the lengths L4 and L6.

41. The addressable fuse array of claim 28 wherein the respective second and third portions of the first and second fusible links are of unitary construction.

42. The addressable fuse array of claim 28 wherein the respective first and second portions of the first and second fusible links are of unitary construction and the first portion includes a metal strip thereon.

43. The addressable fuse array of claim 28 wherein the respective third portions of the first and second fusible links are convolute.

44. The addressable fuse array of claim 28 further comprising a substrate and wherein the respective first and second portions of the first and second fusible links are located on the substrate and the respective third portions of the first and second fusible links are suspend above the substrate.

45. The addressable fuse array of claim 28 wherein the first and second fusible links are polysilicon structures formed on a substrate.

46. The addressable fuse array of claim 28 wherein the first and second fusible links are metal structures formed on a substrate.

47. A fuse array, comprising first and second conductive pads and a plurality of fusible links having different values of resistance, wherein the fusible links are electrically coupled in parallel arrangement to the first and second pads such that a current flowing from the first pad to the second pad passes through each fusible link and wherein a first current blows at least one fusible link so that the at least one fusible link does not conduct current, and the first current does not blow all the fusible links.

48. The fuse array of claim 47, wherein fusible links are elongate and the plurality of fusible links are substantially arranged parallel to one another and located substantially within a same plane.

49. The fuse array of claim 47, further comprising a planar substrate and wherein the fusible links each comprise a first portion located on the planar substrate and a second portion that is spaced apart from the planar substrate and further comprising a member extending between the first portion and the second portion.

50. The fuse array of claim 47, wherein the first and second pads are elongate and located on a same plane and the fusible links extend between the first and second pads on the plane and wherein each fusible link includes a fuse portion that physically breaks when that fusible link is blown.

51. The fuse array of claim 47, wherein the first and second pads are elongate and the first pad is located on a planar substrate and the second pad is space apart from the substrate and the first pad, and the fusible links each include a first portion having a proximal end coupled to the first pad and a second portion having a proximal end coupled to the second pad, and wherein distal ends of the first and second portions of the fusible links are coupled.

52. The fuse array of claim 51, wherein the distal ends of the first and second portions of the fusible links are coupled by a pillar that is substantially elongate and is longitudinally orthogonal to the substrate.

53. The fuse array of claim 47, wherein the fusible links are provided with different resistance values by metallic strips coupled to the fusible links and wherein the metallic strips are arranged as different lengths.

54. The fuse array of claim 47, wherein the first and second pads are elongate and the first pad is located on a planar substrate and the second pad is space apart from the substrate and the first pad, and the fusible links each include a first portion having a proximal end coupled to the first pad and a second portion having a proximal end coupled to the second pad and wherein distal ends of the first and second portions of the fusible links are coupled, and wherein the fusible links are provided with different resistance values by metallic strips coupled to the second portions of the fusible links and wherein the metallic strips are arranged as different lengths.

55. The fuse array of claim 47, further comprising a substrate, and further comprising a conductive mass located proximate the substrate and movable relative to the substrate, and wherein first ends of the fusible links are fixedly coupled to the substrate and second ends of the fusible links are fixedly coupled to the mass for movement therewith such that the fusible links provide a first constraint force to the mass, and wherein the first current blows at least one fusible link so as to provide a second constraint force to the mass.

56. The fuse array of claim 55, wherein a second current lows at least one fusible link that has not been previously blown and the plurality of fusible links provide a third constraint force to the mass.

57. The fuse array of claim 47, wherein the first and second pads are elongate and longitudinal axes of the pads are arranged substantially parallel to one another.

58. The fuse array of claim 47, wherein the first and second pads are elongate and longitudinal axes of the pads are arranged substantially orthogonal to one another.

59. The fuse array of claim 47, further comprising a second plurality of fusible links having values of resistances that substantially match the values of resistances of said plurality of fusible links such that each one of said plurality of fusible links and a respective one of the second plurality of fusible links form a fuse link pair having substantially equal resistance values, and wherein the first current blows at least a first fuse link pair.

60. The fuse array of claim 59, wherein a second current blows a second fuse link pair.

\* \* \* \* \*